United States Patent [19]

Shimkunas

[11] Patent Number: 4,671,850
[45] Date of Patent: Jun. 9, 1987

[54] MASK USING POLYIMIDE TO SUPPORT A PATTERNED X-RAY OPAQUE LAYER

[75] Inventor: Alexander R. Shimkunas, Palo Alto, Calif.

[73] Assignee: Micronix Corporation, Los Gatos, Calif.

[21] Appl. No.: 766,748

[22] Filed: Aug. 16, 1985

[51] Int. Cl.⁴ .................... B44C 1/22; C03C 15/00; H01L 21/306; C23F 1/02

[52] U.S. Cl. .................... 156/643; 156/646; 156/652; 156/655; 156/656; 156/657; 156/659.1; 156/662; 156/345; 204/192.35; 378/35; 430/5

[58] Field of Search ............... 156/639, 643, 646, 652, 156/655, 656, 657, 659.1, 662, 667, 345, 626, 627; 430/5, 313, 316, 321; 204/192 E; 427/8; 378/35

[56] References Cited

U.S. PATENT DOCUMENTS

| | | | |
|---|---|---|---|
| 3,053,720 | 9/1962 | Edds | 156/345 X |
| 3,323,967 | 6/1967 | Wedd | 156/345 |
| 3,841,930 | 10/1974 | Hetrich | 156/345 X |
| 4,384,919 | 5/1983 | Casey | 156/645 |

*Primary Examiner*—William A. Powell
*Attorney, Agent, or Firm*—Kenneth E. Leeds; Alan H. MacPherson; Steven F. Caserza

[57] ABSTRACT

A process for manufacturing a mask for use in x-ray photolithography starts with the step of coating the first and second sides of a silicon wafer (100) with a boron nitride layer (102). The first side of the wafer (100) is coated with a polyimide layer (104) which serves as a primary x-ray transparent layer for supporting a subsequently deposited x-ray opaque material. The first and second sides of the wafer (100) are then covered with a second boron nitride layer (106). The second side of the wafer (100) is then bonded to a support structure such as a pyrex ring (108). A portion of the first and second boron nitride layers (102, 106) is then removed thus exposing a portion of the underlying silicon substrate (101). The exposed portion of the silicon substrate is then removed thus leaving a ring which supports an x-ray transparent membrane comprising the first boron nitride layer (102), the polyimide layer (104) and the second boron nitride layer (106). The second boron nitride layer (106) is then covered with a patterned layer of x-ray opaque material such as gold. The resulting structure is a mask which uses polyimide as the primary membrane and therefore exhibits enhanced mechanical strength.

10 Claims, 18 Drawing Figures

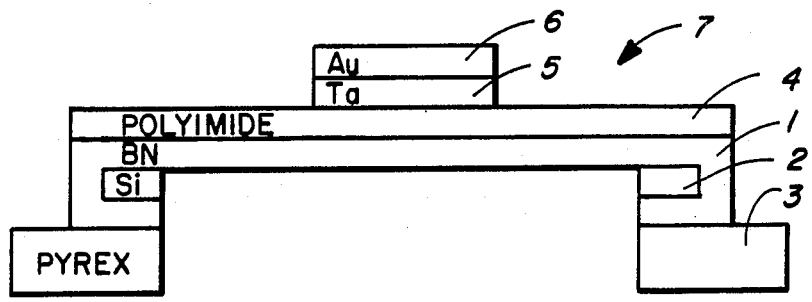
FIG._1
(PRIOR ART)
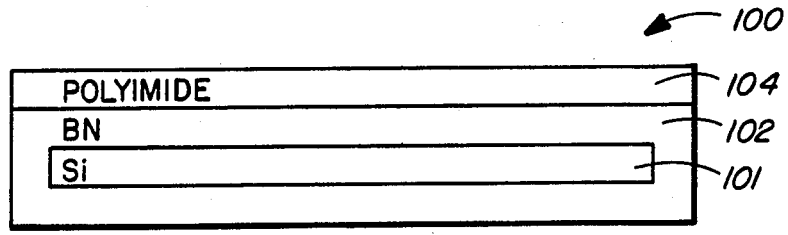
FIG._2
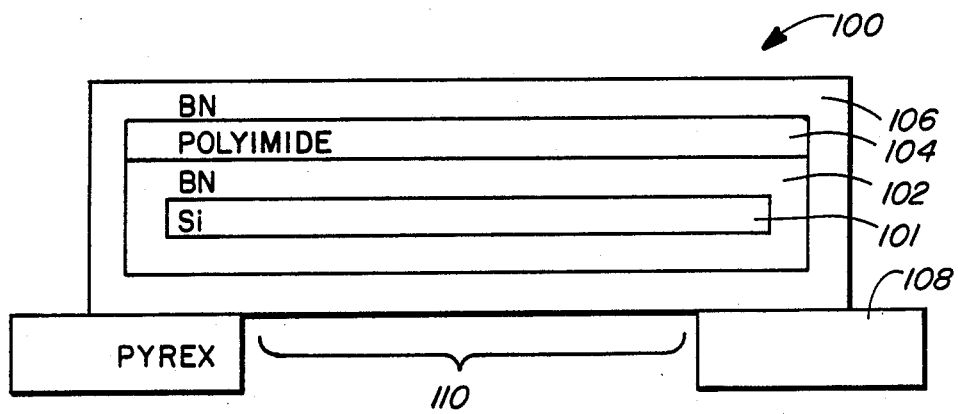
FIG._3
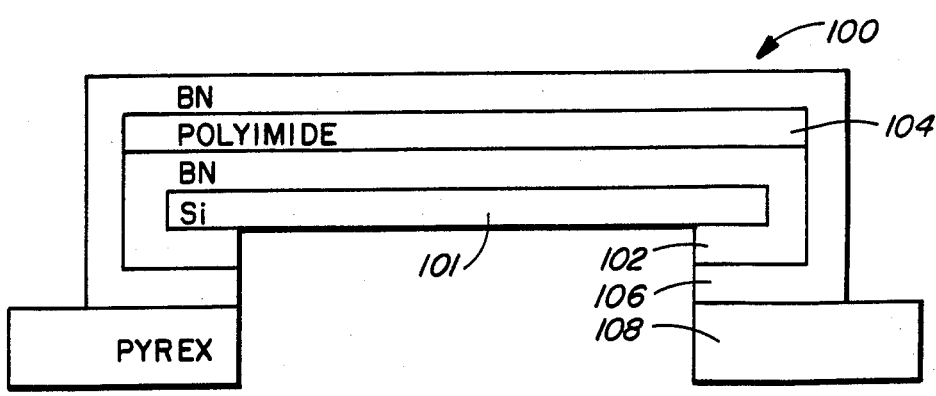
FIG._4

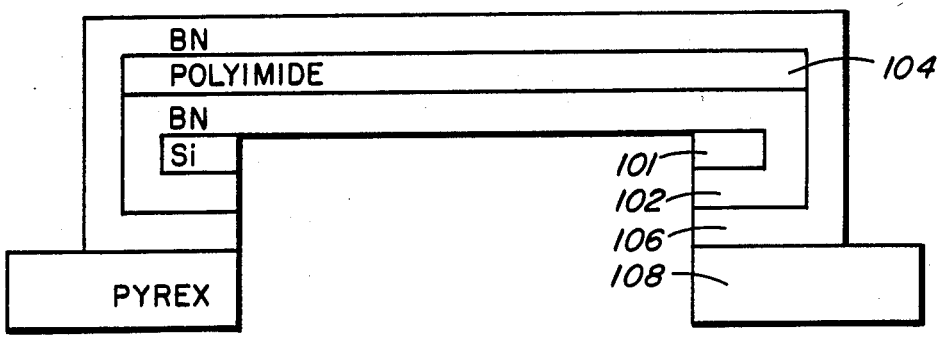
FIG._5
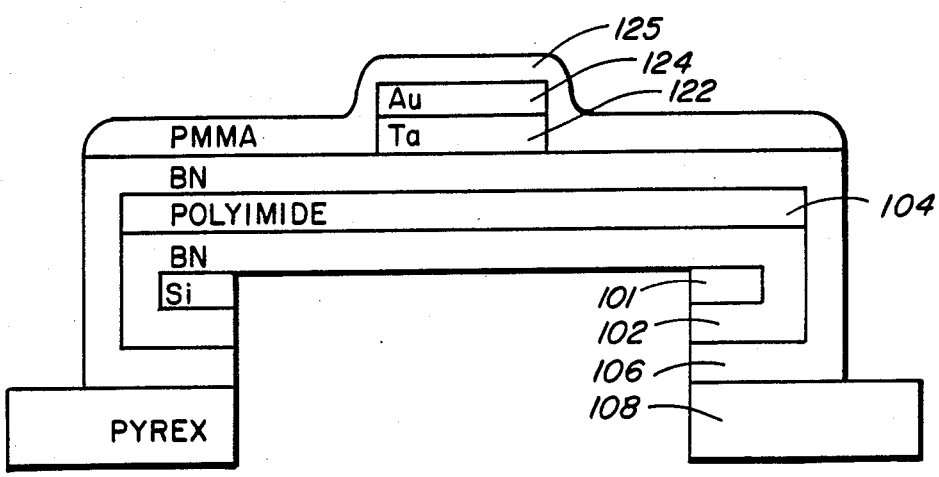
FIG._6
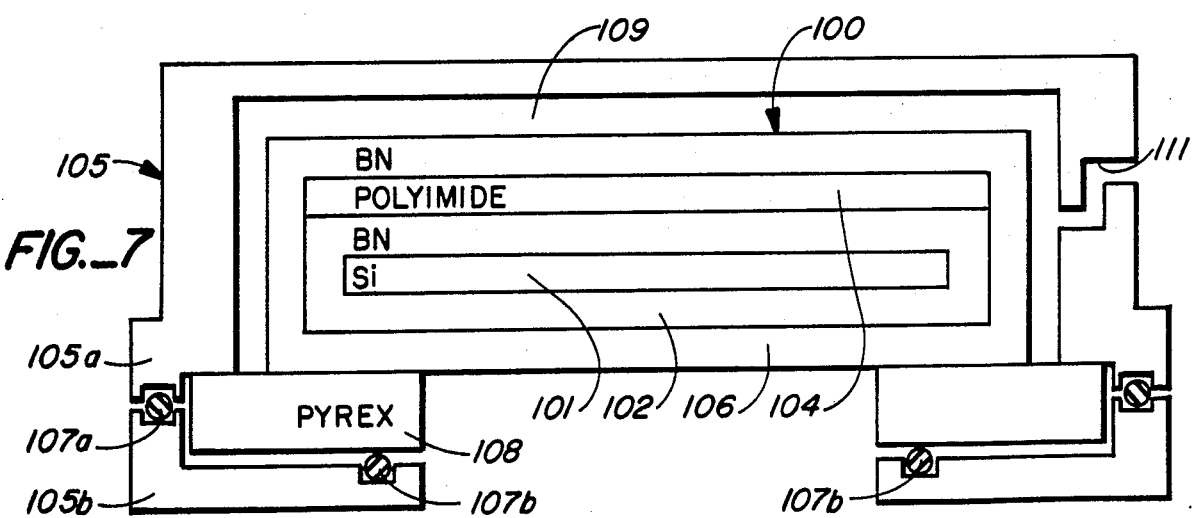
FIG._7
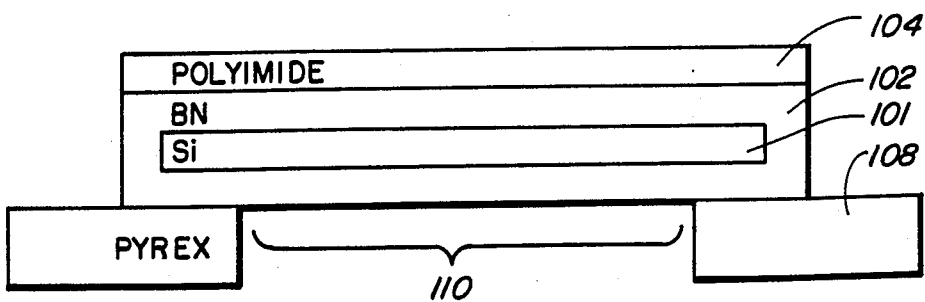
FIG._8

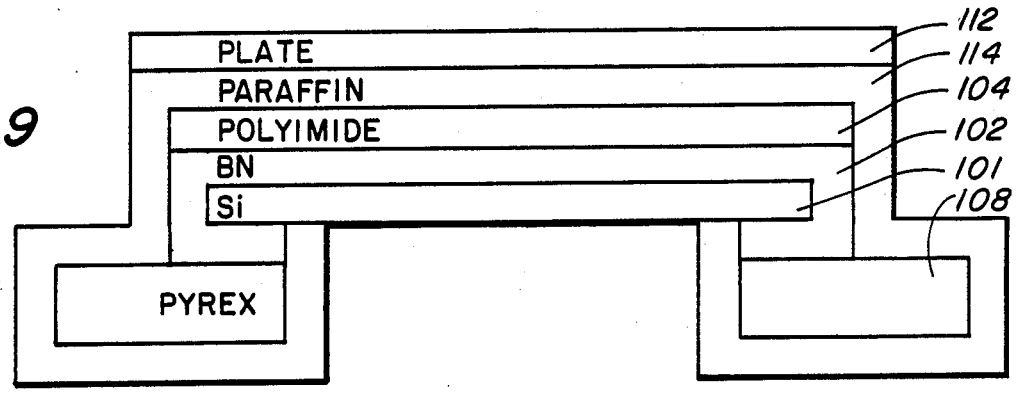
FIG._9
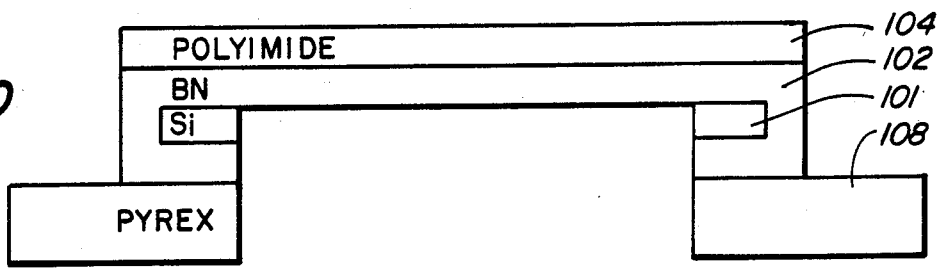
FIG._10
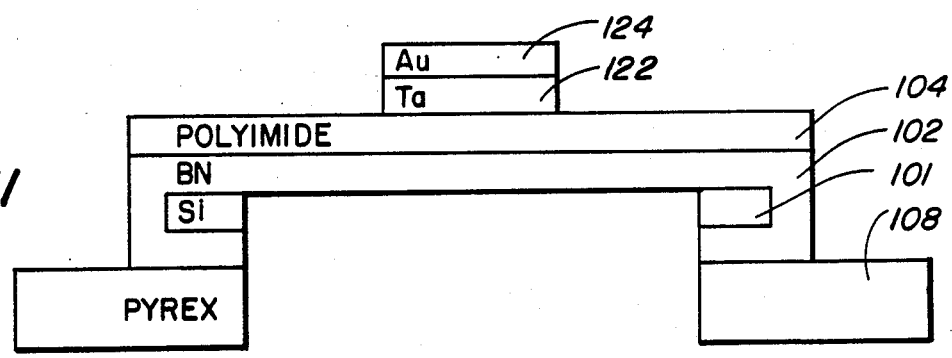
FIG._11
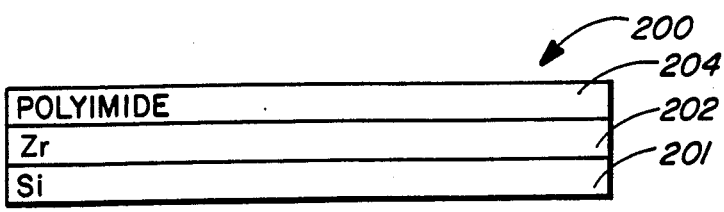
FIG._13

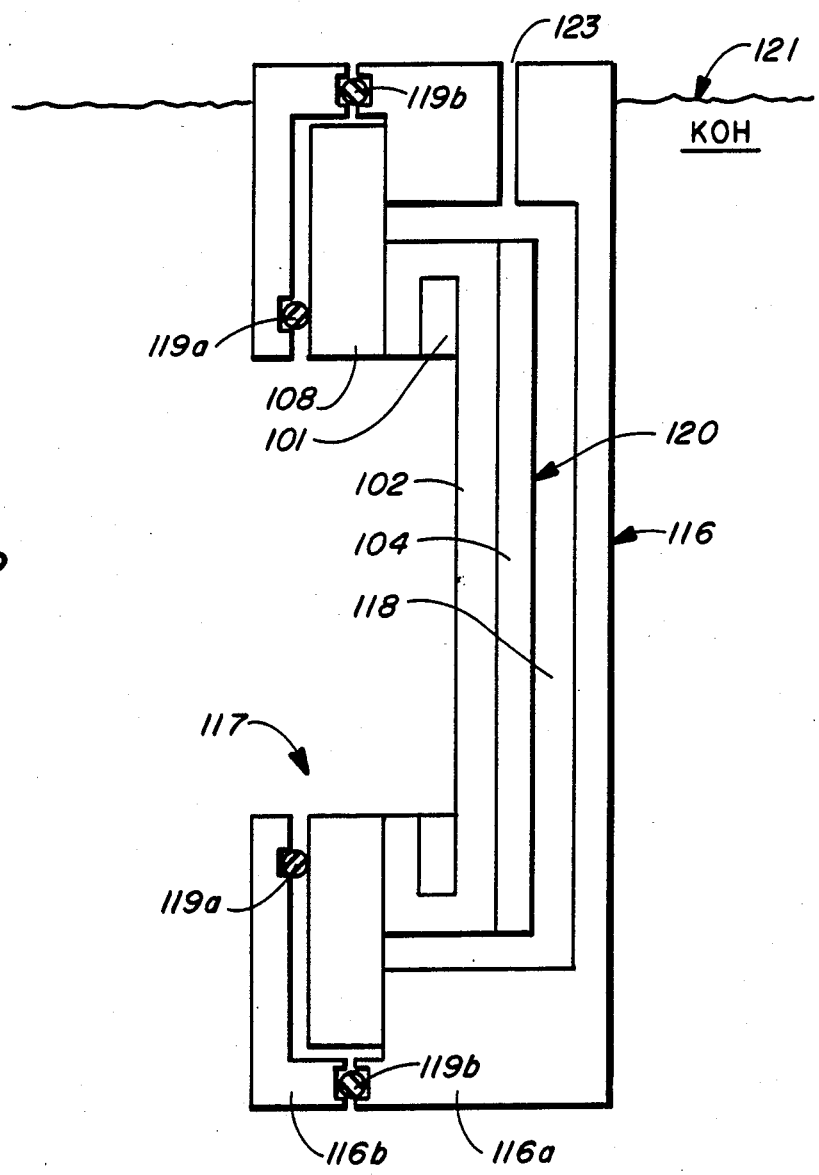
FIG._12
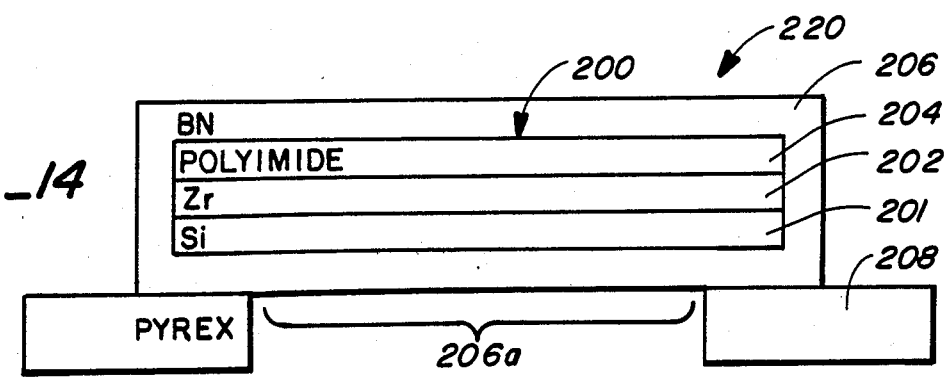
FIG._14

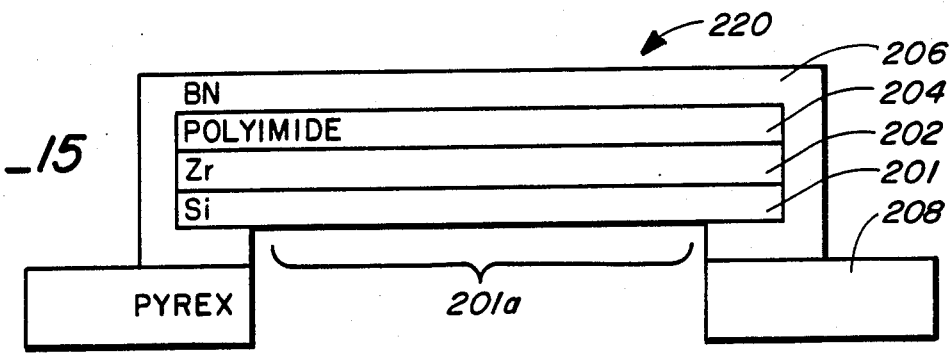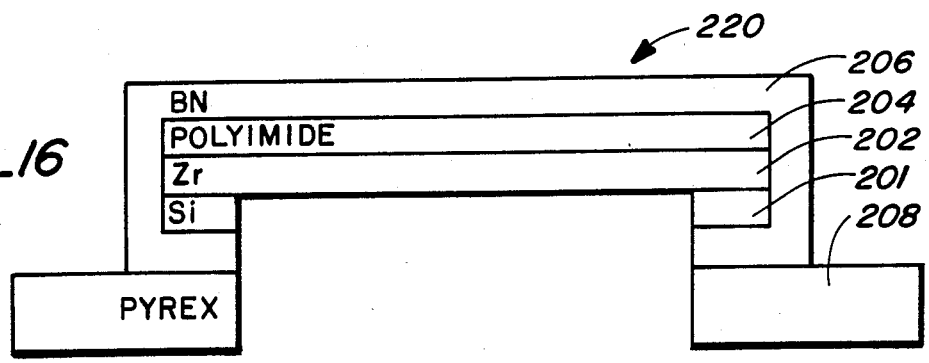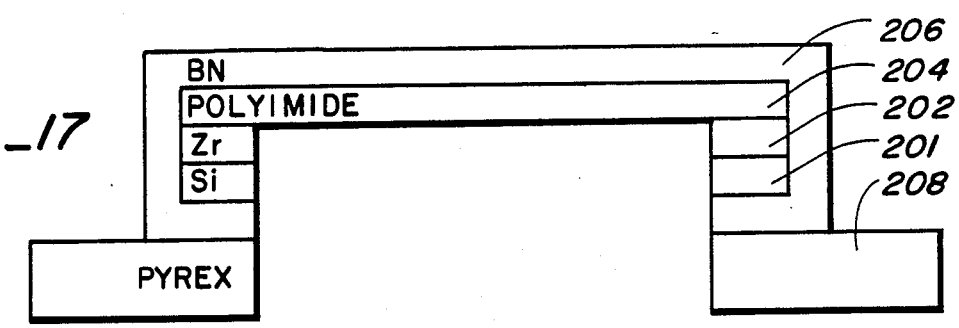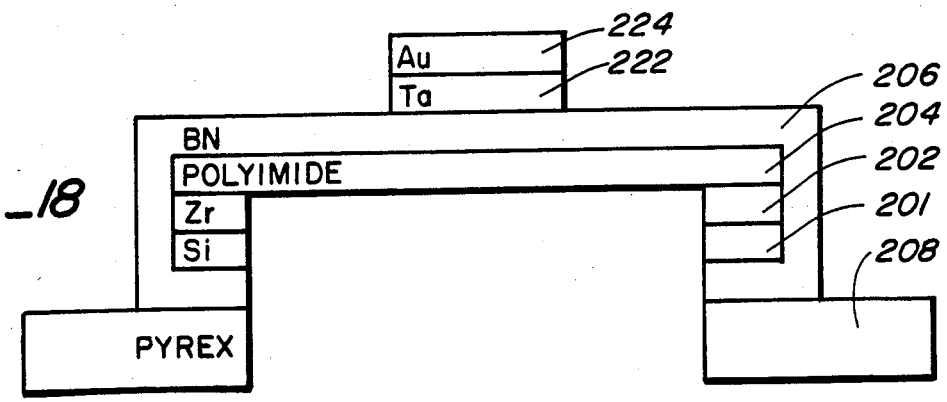

MASK USING POLYIMIDE TO SUPPORT A PATTERNED X-RAY OPAQUE LAYER

BACKGROUND OF THE INVENTION

1. Field of the Invention

This invention relates to masks for use in x-ray photolithography and to processes for manufacturing such masks. This invention also relates to masks used when bringing up alignment apparatus.

2. Description of the Prior Art

It is known in the art to use x-rays in photolithographic processes for manufacturing integrated circuits. In such processes a mask is used which selectively blocks x-rays. An example of such a mask is mask 7 illustrated in FIG. 1. Mask 7 includes an x-ray transparent membrane 1, typically boron nitride, formed on a silicon ring 2. Silicon ring 2 is bonded through a ring of boron nitride to a pyrex ring 3 which serves as a support structure for mask 7. A polyimide layer 4 is formed on boron nitride membrane 1 to provide enhanced mechanical support for membrane 1. A patterned gold layer 6 (which is x-ray opaque) and a similarly patterned tantalum layer 5 (which bonds to both gold and polyimide) is formed on polyimide layer 4. Gold layer 6 selectively blocks x-rays during photolithographic processes for manufacturing integrated circuits. In a typical prior art mask, boron nitride membrane 1 is between 3 and 5 microns thick and polyimide layer 4 is about 2 microns thick.

Although mask 7 of FIG. 1 performs well in x-ray photolithographic processes, it is easily damaged. Accordingly, it is desirable to provide a mask having enhanced mechanical strength. Such a mask is useful when first bringing up alignment apparatus. As used in this specification, "bringing up alignment apparatus" means turning on the alignment apparatus for the first time, i.e. after receiving the apparatus from the manufacturer. As is known in the art, alignment apparatus is used during the fabrication of semiconductor devices to selectively expose photoresist on a set of wafers through a mask. Each wafer within the set is placed on a support chuck which moves with respect to the mask when it is desired to align the mask and the wafer. When first bringing up alignment apparatus, it is possible for a wafer to strike and damage the mask before fine mechanical adjustments have been made to the alignment apparatus.

SUMMARY OF THE INVENTION

A process in accordance with my invention is used to produce a novel mask having enhanced strength. The mask is typically used when bringing up alignment apparatus. After appropriate mechanical adjustments have been made to the alignment apparatus, the mask is replaced with a conventional mask such as prior art mask 7 described above. The alignment apparatus is then used to produce integrated circuits.

A process in accordance with my invention for manufacturing a mask having enhanced strength begins with the step of coating both sides of a wafer (typically a silicon wafer) with an x-ray transparent layer (typically boron nitride). A polyimide layer is then formed on a first side of the boron nitride coated wafer. A second layer of x-ray transparent material (typically boron nitride) is then formed on both side of the wafer. As described below, the polyimide layer subsequently serves as a primary support for a subsequently formed patterned layer of x-ray opague material and the first and second boron nitride layers protect the polyimide during a subsequent silicon etch.

The second side of the wafer is then bonded to a support structure such as a pyrex ring. A portion of the second boron nitride layer is exposed through the interior of the pyrex ring. The exposed portion of the second boron nitride layer and the portion of the first boron nitride layer lying thereunder are removed, thus exposing a portion of the underlying silicon. The exposed silicon is then etched away. In one embodiment, the silicon is etched with either acid or KOH. Of importance, the remaining portions of the first and second boron nitride layers on the first side of the wafer protect the polyimide layer during the silicon etch.

At this point in the process, the to-be-formed mask comprises a silicon ring having a first side covered with an x-ray transparent membrane including the first boron nitride layer, the polyimide layer, and the second boron nitride layer. The silicon ring is bonded through a boron nitride ring to the pyrex ring support structure.

A patterned x-ray opaque layer is then formed on the x-ray transparent membrane. The resulting structure is then coated with a protective layer of material such as polymethyl methacrylate (PMMA). Of importance, the polyimide layer is under greater tensile stress than the first and second boron nitride layers. Therefore, the polyimide layer exerts most of the force (through the second boron nitride layer) that prevents the x-ray opaque layer from moving relative to the rest of the mask. Thus, the polyimide layer serves as the "primary support" for the x-ray opaque layer. In contrast, in prior art mask 7 of FIG. 1, boron nitride membrane 1 is under greater tensile stress than polyimide layer 4. Therefore, boron nitride membrane 1 exerts most of the force (through polyimide layer 4) that prevents gold layer 6 and tantalum layer 5 from moving relative to the rest of mask 7. Thus, in prior art mask 7, boron nitride membrane 1 is the primary support for gold layer 6 and tantalum layer 5.

The polyimide layer used as the primary support for the x-ray opaque layer is stronger and therefore less susceptible to tearing than prior art boron nitride membrane 1. Accordingly, a mask constructed in accordance with my invention is particularly useful when bringing up alignment apparatus. After the fine mechanical adjustments are made in the alignment apparatus, the mask is then replaced with a more conventional x-ray photolithography mask. This is because the polyimide can shrink or stretch in response to changes in temperature or humidity, thus distorting the pattern of the x-ray opaque layer. (The polyimide layer can also stretch or shrink when the x-ray opaque layer is patterned).

In accordance with another embodiment of my invention, instead of forming the second boron nitride layer, after the first side of the wafer is coated with polyimide, the second side of the wafer is bonded to a pyrex ring. A portion of the first boron nitride layer on the second side of the wafer is exposed through the interior of the pyrex ring. The exposed portion of the boron nitride layer is removed, thus exposing a portion of the underlying silicon. The exposed silicon is then removed. This is typically done using an acid or KOH etch. The polyimide is protected using a mechanical masking fixture.

In one embodiment, the mechanical masking fixture includes a concave metal cover that is clamped onto the to-be-formed mask to cover the polyimide layer. The mechanical masking fixture forms an airtight seal with the pyrex ring. A cavity is formed between the mechanical masking fixture and the polyimide layer. The air pressure in the cavity is controlled to approximate the pressure of the etching solution so that when the exposed portion of silicon is removed, the difference between the cavity air pressure and the etching solution pressure does not burst the boron nitride and polyimide layers.

BRIEF DESCRIPTION OF THE DRAWINGS

FIG. 1 illustrates in cross section a prior art mask.

FIGS. 2 through 6 illustrate in cross section a mask during a manufacturing process in accordance with one embodiment of my invention.

FIG. 7 illustrates an aluminum masking fixture 105 protecting portions of a boron nitride layer 106.

FIGS. 8 through 11 illustrate in cross section a mask during a manufacturing process in accordance with another embodiment of my invention.

FIG. 12 illustrates a mechanical masking fixture 116 protecting a mask during a KOH etching process.

FIGS. 13 through 18 illustrate a mask during a manufacturing process in accordance with another embodiment of the invention.

DETAILED DESCRIPTION

The process of one embodiment of my invention starts by coating both sides of a silicon wafer 100 with a boron nitride layer 102 (FIG. 2). Wafer 100 typically has a 125 millimeter diameter, a 625 micron thickness, and a [100] crystal orientation, but other diameters and thicknesses are also appropriate. Wafer 100 is typically undoped or lightly doped. Boron nitride layer 102 is typically 0.5 to 1.0 microns thick and is deposited with a low pressure chemical vapor deposition (LPCVD) process at a deposition temperature of about 340° C. Hereinafter, the term water 100 will be used to refer to the silicon wafer and all layers formed thereon and the term silicon substrate 101 will be used to refer only to the silicon within wafer 100.

A polyimide layer 104, is then formed on one side of the wafer 100. This is typically done by spinning on a layer of polyimide precursor such as Pyralin model no. 2555, available from DuPont, and curing the polyimide precursor. The precursor is cured by baking it at 90° C. for 30 minutes, raising the temperature from 90° C. to 150° C., baking it at 150° C. for 30 minutes, raising the temperature from 150° C. to 380° C. and baking it at 380° C. for about an hour in that sequence. As described below, polyimide layer 104 will serve as a primary x-ray transparent support membrane for a subsequently deposited patterned layer of x-ray opaque material such as gold. Polyimide layer 104 typically has a thickness greater than 3 microns to ensure that it is adequately strong. In addition, polyimide layer 104 is typically less than 10 microns thick to minimize x-ray absorption by polyimide layer 104. Boron nitride layer 102 protects polyimide layer 104 during a subsequent silicon etching process described below.

Of importance, because polyimide layer 104 is the primary support for subsequently deposited x-ray opaque material, it is desirable that layer 104 be under tension so that it does not move with respect to the rest of the mask. Because of the above-mentioned curing process, polyimide layer 104 has a tensile stress greater than $6 \times 10^8$ dynes/cm$^2$, which is greater than the tensile stress in boron nitride layer 102.

In one embodiment of the invention, it is desirable to monitor the stress in polyimide layer 104. This is done by measuring the bowing in wafer 100 caused by the tension in polyimide layer 104. Specifically, before coating wafer 100 with polyimide layer 104, wafer 100 is placed on a set of supports so that wafer 100 is in proximity to a capacitive probed such as the probed described in my copending U.S. Pat. application Ser. No. 758,596, entitled "Process for Making a Mask Used in X-Ray Photolithography", filed July 23, 1985, assigned to the assignee of the present invention and incorporated herein by reference. The capacitive probe provides a first measurement indicative of the distance between wafer 100 and the probe. Wafer 100 is then removed from the supports and polyimide layer 104 is formed. Wafer 100 is then placed back on the supports so that the side not covered by polyimide 104 rests on the supports. The probe provides a second measurement indicative of the distance between the probe and wafer 100. The difference between the first and second distances is used to calculate tensile stress in polyimide layer 104 as described in my above-incorporated application. If the measured stress is less than $6 \times 10^8$ dynes/cm$^2$, wafer 100 is heated again, which increases the stress in polyimide layer 104.

Referring to FIG. 3, wafer 100 is then coated on both sides with a second boron nitride layer 106. Second boron nitride layer 106 is typically 0.5 to 1.0 microns thick and is deposited in an LPCVD process at a deposition temperature of 340° C. It will be appreciated by those skilled in the art that one reason polyimide layer 104 is cured at 380° C. is to prevent out-gassing during the deposition of second boron nitride layer 106. (Outgassing is a phenomenon during which gas escapes from polyimide layer 104.)

Wafer 100 is then bonded to a pyrex ring 108. This is typically done using an epoxy adhesive such as model no. 353ND manufactured by Epoxy Technology, Inc. Pyrex ring 108 has a coefficient of thermal expansion $(3.3 \times 10^6/°C.)$ which approximately matches that of silicon $(2.6 \times 10^6/°C.)$. In one embodiment, pyrex ring 108 is of a type such as 7740 pyrex, manufactured by Corning Glass Co. of Corning, N.Y. Pyrex ring 108 serves as a support for the to-be-formed mask.

A portion 110 of boron nitride layers 102 and 106 on one side of wafer 100 is then removed, e.g., by a barrel plasma etch using an 84% CH$_4$-16% O$_2$ plasma at 500 mTorr and 200 watts, thus exposing a portion of silicon substrate 101. The boron nitride on the other side of wafer 100 is protected by a thick photoresist backlap such as a surface protective resin type no. 650/MX936 (not shown) available from Kodak or by an aluminum masking fixture 105 (FIG. 7). FIG. 7 illustrates aluminum masking fixture 105 protecting boron nitride layers 102 and 106 on the top side of wafer 100. Masking fixture 105 includes a cover 105a which covers boron nitride layer 106 on top of wafer 100 and a clamping fixture 105b. Cover 105a and clamping fixture 105b clamp over pyrex ring 108. A silicone rubber O-ring 107b affixed to clamping fixture 105b forms an air-tight seal with pyrex ring 108. A silicone rubber O-ring 107a affixed to cover 105b forms an air-tight seal with clamping fixture 105b. In this way, plasma is permitted to etch boron nitride layer 102 and 106 on the bottom of wafer 100 but cannot come into contact with and etch boron nitride 106 on top of wafer 100.

Also illustrated in FIG. 7 is a cavity 109 between wafer 100 and cover 105a. Before plasma etching, it is necessary to reduce gas pressure in the etching chamber. A hole 111 in cover 105a permits gas to escape from cavity 109 so that the pressure in cavity 109 equals the pressure in the etching chamber. Similarly, when etching is completed and gas pressure is increased in the etching chamber, hole 111 permits gas to enter cavity 109. In this way, a pressure differential which could damage wafer 100 is avoided. Of importance, hole 11 follows a tortuous path such as the one illustrated which prevents plasma from entering cavity 109.

After the boron nitride 102 and 106 on the bottom of wafer 100 is removed, aluminum masking fixture 105 is removed, leaving the structure illustrated in FIG. 4.

Referring to FIG. 5, the portion of silicon substrate 101 exposed during the boron nitride etch is etched away be soaking the to-be-formed mask in a KOH solution. Boron nitride layers 102 and 106 protect polyimide layer 104 during the KOH etching process. The mask is then removed from the KOH solution and rinsed with hot (approximately 70° C.) deionized water.

After the exposed portion of silicon substrate 101 is removed, the remaining structure is coated with a tantalum layer 122 and a gold layer 124 (FIG. 6). Tantalum and gold layers 122 and 124 are then patterned in a manner described in my above-incorporated U.S. Pat. application Ser. No. 758,596. The mask is then coated with a protective layer such as PMMA layer 125.

In accordance with another embodiment of my invention, after polyimide layer 104 is formed on wafer 100, wafer 100 is bonded to a support structure such as pyrex ring 108 as illustrated in FIG. 8. A portion 110 of boron nitride layer 102 on oen side of wafer 100 is removed, e.g., by a barrel plasma etch as described above. Polyimide layer 104 on the other side of wafer 100 is protected by the above-described surface protective resin or aluminum masking fixture 105. The removal of portion 110 of boron nitride layer 102 exposes a portion of silicon substrate 101. The exposed portion of substrate 101 is then removed using either a KOH or an acid etchant such as a solution of hydrofluoric, nitric and acetic acids. If an acid etchant is used, polyimide layer 104 and pyrex ring 108 are protected with a wax such as paraffin 114 (FIG. 9). In addition, a plate 112 which is either stainless steel or $Al_2O_3$ is placed on paraffin layer 114 as illustrated in FIG. 9 to protect polyimide layer 104 from mechanical damage during the etching process.

Thereafter, the structure of FIG. 9 is soaked in an acid solution until the exposed portion of silicon substrate 101 is removed. The to-be-formed mask is then removed from the acid solution. Plate 112 is removed and wax 114 is dissolved, for example, in xylene. The resulting structure is illustrated in FIG. 10. Polyimide layer 104 is then coated with tantalum layer 122 and gold layer 124 (FIG. 11) and the tantalum and gold are then patternedd as described above.

In an alternative embodiment, the exposed portion of silicon 101 is removed with KOH while polyimide layer 104 is protected using a metal (typically stainless steel) masking fixture 116 (FIG. 12) similar to masking fixture 105 of FIG. 7. Metal masking fixture 116 comprises a concave cover 116a and a clamping fixture 116b which clamp over pyrex ring 108. Cover 116a completely covers polyimide layer 104 while clamping fixture 116b includes a centrally defined aperture 117 through which silicon substrate 101 is exposed. A silicon rubber O-ring 119a affixed to clamping fixture 116b forms an air-tight seal with pyrex ring 108 and O-ring 119b affixed to cover 116 forms an air-tight seal with clamping fixture 116b. Metal masking fixture 116 and to-be-formed mask 120 are then placed in a KOH solution 121. As can be seen in FIG. 12, there is a cavity 118 between to-be-formed mask 120 and metal masking fixture 116. If this cavity if filled with air at one atmosphere of pressure, when silicon substrate 101 is etched away, there will be a pressure differential caused by the pressure of KOH 121 on one side of mask 120 and the air pressure in cavity 118. If there is no place for the air in cavity 118 to escape, as the air temperature in cavity 118 increases, so does the air pressure. (This would happen because KOH solution 121 is typically at 95° C.) The increase in air could cause boron nitride layer 102 and polyimide layer 104 to burst. In order to prevent this pressure differential pressure from damaging boron nitride layer 102 and polyimide layer 104, in accordance with one embodiment of the invention, a hole 123 is provided in fixture 116 to permit air to escape from cavity 118. In another embodiment, the air pressure in cavity 118 is modified to more accurately balance the pressure of KOH solution 121 on layers 102 and 104 by pumping air (or another gas) into or out of cavity 118 through hole 123. In such an embodiment, since the pressure of KOH solution 121 against layers 102 and 104 is known (e.g. because layers 102 and 104 are a known depth below the surface of KOH solution 121), air is pumped into cavity 118 to match that pressure. In another embodiment of the invention, cavity 118 is filled with an inert liquid which counterbalances the pressure caused by KOH solution 121 in which masking fixture 116 rests.

In accordance with another embodiment of the invention, instead of using boron nitride layer 102 to protect polyimide layer 104, a zirconium layer is used. In this embodiment, a first side of a silicon substrate 201 is coated with a zirconium layer 202 (FIG. 13). Zirconium layer 202 is sputtered onto substrate 201 to a thickness of 1500 to 2000Å. A polyimide layer 204 (typically 3 to 10 microns thick) is then formed on zirconium layer 202 as described above. Referring to FIG. 14, both sides of wafer 200 are then coated with a boron nitride layer 206. Boron nitride layer 206 is typically 0.5 to 1.0 microns thick. The second side of wafer 200 is then bonded to a pyrex ring 208.

Referring to FIG. 14, a portion 206a of boron nitride layer 206 is removed, e.g., with a barrel plasma etching process as described above. After that, a portion 201a (FIG. 15) of silicon substrate 201 (exposed by removal of portion 206a of boron nitride 206) is removed by soaking to-be-formed mask 220 in a KOH solution, leaving the structure of FIG. 17. Of importance, zirconium layer 202 protects polyimide layer 204 from the KOH etchant.

The portion of zirconium layer 202 exposed by the removal of portion 201a of silicon substrate 201 is then removed by soaking mask 220 in an HF solution having a 1% concentration at room temperature. No additional protective layers are required for this process, as mask 220 is soaked for an insufficient period of time to damage pyrex ring 208 or polyimide layer 204. The resulting structure is illustrated in FIG. 17.

A layer of tantalum 222 and a layer of gold 224 are deposited on boron nitride layer 206 as described above and patterned. (FIG. 18) The resulting structure is a mask having enchance strength for use when bringing up alignment apparatus.

While the invention has been described with regard to specific embodiments, those skilled in the art will recognize that modifications can be made in form and detail without departing from the spirit and scope of the invention. For example, instead of using silicon substrate 101, a glass substrate can be used. (In such an embodiment, an etchant such as hydroflouric acid is used to etch the glass substate.) In addition, mechanical masking fixtures 105 and 116 can be used to manufacture other types of masks. Accordingly, all such modifications come within the present invention.

I claim:

1. A process of etching a substrate comprising the steps of:
   providing a substrate of a first material having a first side and a second side, at least a portion of said first side being covered with a layer of a second material;
   affixing a masking fixture to said covered substrate, said masking fixture protecting said layer, a cavity being formed between said layer and said masking fixture, at least a portion of said second side of said substrate not being protected by said masking fixture;
   placing said masking fixture and said covered substrate in an etching fluid, said etching fluid etching said unprotected portion; and
   controlling the pressure in said cavity to reduce the difference between the pressure of the fluid against said substrate and the pressure in the cavity.

2. The process of claim 1 wherein said fluid is an etching solution and said cavity is filled with a gas, said step of controlling comprising the step of modifying the gas pressure in said cavity, to reduce the difference between the pressure of the solution against said substrate and the gas pressure in the cavity.

3. The process of claim 1 wherein said substrate is affixed to a support structure, said step of affixing comprising the step of affixing said masking fixture to said support structure.

4. The process of claim 1 wherein said substrate is covered with a layer of a third material, said layer of said third material being covered by said layer of said second material, said layer of said third material protecting said second material.

5. A process for etching a substrate comprising:
   forming a layer of a first material on a substrate;
   affixing said substrate to a masking fixture, said masking fixture covering said layer, at least a portion of said substrate not being protected by said masking fixture, a cavity being formed between said masking fixture and said second layer;
   providing a liquid in said cavity; and
   placing said coated substrate and masking fixture in an etching solution, the liquid pressure in said cavity tending to balance the etching solution pressure.

6. A process comprising the steps of:
   providing a structure having a first surface covered with a layer of a first material and a second surface covered with a layer of a second material;
   affixing a masking fixture to said structure so that said masking fixture covers and protects said layer of said second material, a cavity being formed between said layer of said second material and said masking fixture;
   etching said layer of said first material; and
   permitting gas from said cavity to leave said cavity, thereby controlling gas pressure in said cavity.

7. The process of claim 6 wherein said step of etching comprises a plasma etching process.

8. The process of claim 6 wherein said masking fixture has a hole following a tortuous path, said hole permitting gas from said cavity to leave said cavity without permitting plasma to enter said cavity.

9. A process comprising the steps of:
   providing a structure including a first layer of first material on one side and a second layer of a second material on the other side;
   affixing a masking fixture to said structure so that said masking fixture covers and protects said second layer of said second material, a cavity being formed between said second layer of said second material and said masking fixture;
   etching said first layer of said first material; and
   permitting fluid to flow into or out of said cavity, to thereby reduce any difference between the pressure pushing on each side of said structure.

10. The process of claim 9 wherein said first material is the same as said second material.

* * * * *

UNITED STATES PATENT AND TRADEMARK OFFICE
CERTIFICATE OF CORRECTION

PATENT NO. : 4,671,850

DATED : June 9, 1987

INVENTOR(S) : Alexander R. Shimkunas

It is certified that error appears in the above-identified patent and that said Letters Patent is hereby corrected as shown below:

Col. 1, line 66, "side" should read --sides--.

Col. 2, line 50, "photolithography" should read --photolithographic--

Col. 3, line 41, "water" should read --wafer--.

Col. 4, line 10, "probed" should read --probe-- (both occurrences).

Col. 4, line 66, "105b" should read --105a--.

Col. 5, line 12, "hole 11" should read --hole 111--.

Col. 5, line 20, "be" should read --by--.

Col. 5, line 36, "oen" should read --one--.

Col. 5, line 60, "patternedd" should read --patterned--.

Col. 6, line 51, "porticn" should read --portion--.

Col. 6, line 66, "tantanlum" should read --tantalum--.

Col. 7, line 10, "substate" should read --substrate--.

Col. 8, line 9, "second layer" should read --first material--.

Signed and Sealed this

Tenth Day of November, 1987

Attest:

DONALD J. QUIGG

Attesting Officer      Commissioner of Patents and Trademarks